United States Patent
Sung et al.

(10) Patent No.: US 9,178,035 B1
(45) Date of Patent: Nov. 3, 2015

(54) METHODS OF FORMING GATE STRUCTURES OF SEMICONDUCTOR DEVICES

(71) Applicant: GLOBALFOUNDRIES Inc., Grand Cayman (KY)

(72) Inventors: Min Gyu Sung, Latham, NY (US); Chanro Park, Clifton Park, NY (US); Hoon Kim, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/459,446

(22) Filed: Aug. 14, 2014

(51) Int. Cl.
*H01L 21/3205* (2006.01)
*H01L 29/66* (2006.01)
*H01L 21/3213* (2006.01)

(52) U.S. Cl.
CPC .... *H01L 29/66545* (2013.01); *H01L 21/32139* (2013.01)

(58) Field of Classification Search
None
See application file for complete search history.

(56) References Cited

U.S. PATENT DOCUMENTS

2012/0139062 A1* 6/2012 Yuan et al. .................... 257/411

* cited by examiner

*Primary Examiner* — Kyoung Lee
(74) *Attorney, Agent, or Firm* — Amerson Law Firm, PLLC

(57) ABSTRACT

One method of forming replacement gate structures for first and second devices, the first device being a short channel device and the second device being a long channel device, is disclosed which includes forming a first and a second gate cavity above a semiconductor substrate, the first gate cavity being narrower than the second gate cavity, forming a bulk metal layer within the first and second gate cavities, performing an etching process to recess the bulk metal layer within the first and second gate cavities, resulting in the bulk metal layer within the second gate cavity being at its final thickness, forming a masking layer over the bulk metal layer within the second gate cavity, and performing an etching process to further recess the bulk metal layer within the first gate cavity, resulting in the bulk metal layer within the first gate cavity being at its final thickness.

20 Claims, 14 Drawing Sheets

METHODS OF FORMING GATE STRUCTURES OF SEMICONDUCTOR DEVICES

BACKGROUND OF THE INVENTION

1. Field of the Invention

The present disclosure generally relates to the formation of semiconductor devices and, more specifically, to various methods of forming gate structures of semiconductor devices.

2. Description of the Related Art

The fabrication of advanced integrated circuits, such as CPUs, storage devices, ASICs (application specific integrated circuits) and the like, requires the formation of a large number of circuit elements in a given chip area according to a specified circuit layout, wherein so-called metal oxide semiconductor field effect transistors (MOSFETs or FETs) represent one important type of circuit element that substantially determines performance of the integrated circuits. The transistors are typically either NMOS (NFET) or PMOS (PFET) type devices wherein the "N" and "P" designation is based upon the type of dopants used to create the source/drain regions of the devices. So-called CMOS (Complementary Metal Oxide Semiconductor) technology or products refers to integrated circuit products that are manufactured using both NMOS and PMOS transistor devices.

Field effect transistors, whether an NMOS or a PMOS device, typically have a source region, a drain region, a channel region that is positioned between the source region and the drain region, and a gate electrode positioned above the channel region. Current flow through the FET is controlled by controlling the voltage applied to the gate electrode. For an NMOS device, if there is no voltage (or a logically low voltage) applied to the gate electrode, then there is no current flow through the device (ignoring undesirable leakage currents, which are relatively small). However, when an appropriate positive voltage (or logically high voltage) is applied to the gate electrode, the channel region of the NMOS device becomes conductive, and electrical current is permitted to flow between the source region and the drain region through the conductive channel region. For a PMOS device, the control voltages are reversed. Field effect transistors may come in a variety of different physical shapes, e.g., so-called planar FET devices or so-called 3D or FinFET devices.

For many early device technology generations, the gate structures of most transistor elements have been made of a plurality of silicon-based materials, such as a silicon dioxide and/or silicon oxynitride gate insulation layer, in combination with a polysilicon gate electrode. However, as the channel length of aggressively scaled transistor elements has become increasingly small, many newer generation devices employ gate structures that contain alternative materials in an effort to avoid the short channel effects which may be associated with the use of traditional silicon-based materials in reduced channel length transistors. For example, in some aggressively scaled transistor elements, which may have channel lengths on the order of approximately 10-32 nm or less, gate structures that are made of a so-called high-k dielectric gate insulation layer (k value of 10 or greater) and one or more metal layers that function as the gate electrode (HK/MG) have been implemented. Such alternative gate structures have been shown to provide significantly enhanced operational characteristics over the heretofore more traditional silicon dioxide/polysilicon gate structure configurations.

In many cases, the metal-containing gate structures are formed by performing well-known replacement gate processing techniques. In general, the replacement gate technique involves forming a sacrificial gate structure (e.g., a silicon dioxide gate insulating layer and a polysilicon gate electrode) and a gate cap layer, followed by forming a protective sidewall spacer adjacent the gate structure. The sacrificial gate structure is eventually removed to define a replacement gate cavity between the spacer. Thereafter, the high-k gate insulating layer and the various layers of metal that will comprise the gate electrode are sequentially deposited in the gate cavity. Excess materials positioned outside of the gate cavity are removed by performing one or more chemical mechanical polishing (CMP) process operations. Next, one or more recess etching processing operations are performed to remove some of the materials within the gate cavity to create a space for the formation of a protective gate cap layer. The gate cap layer is formed by overfilling the recessed cavity with a material, such as silicon nitride, and thereafter performing a CMP process to remove the excess gate cap materials.

In modern device fabrication, transistors having relative short channel lengths and transistors having relatively long channel lengths are formed on the same substrate. Unfortunately, some of the metal materials employed in such metal gate structures, such as tungsten, have different etch characteristics depending upon the channel length of the transistor device, due to differences in grain sizes. Accordingly, during the recess etching process that is performed to make room for the gate cap layer above the replacement metal-containing gate structure, some of the gate structure materials may be inadvertently removed or etched, leading to poor device performance or lower yield. More specifically, etching the gate structures of devices having different channel lengths may result in uneven and inadvertent etching of at least the metal gate materials, such as tungsten or the like, due to the larger grain size and surface area of the metal material in the longer channel devices.

The present disclosure is directed to various methods of forming gate structures of semiconductor devices and the resulting devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming gate structures of semiconductor devices and the resulting devices. One illustrative method disclosed herein includes forming replacement gate structures for first and second devices. The first device is a short channel device and the second device is a long channel device. The method includes forming a first and a second gate cavity above a semiconductor substrate for the first and second devices, respectively, the first gate cavity being narrower than the second gate cavity. The method further includes forming a bulk metal layer within the first and second gate cavities. The method further includes performing at least one etching process to recess the bulk metal layer within the first and second gate cavities. The etching process recesses the bulk metal layer within the second gate cavity to its final thickness. The method further includes forming a masking layer over the bulk metal layer within the second gate cavity. The method further includes performing at least one etching process to further recess the bulk metal layer within the first gate cavity. The etching process recesses the bulk metal layer within the first gate cavity to its final thickness, and the masking layer protects the bulk metal layer within the second gate cavity from the etching process.

Another illustrative method disclosed herein includes forming replacement gate structures for first and second devices. The first device is a short channel device and the second device is a long channel device. The method includes forming a first and a second gate cavity above a semiconductor substrate for the first and second devices, respectively, the first gate cavity being narrower than the second gate cavity. The method further includes forming a bulk metal layer within the first and second gate cavities, the bulk metal layer filling the first gate cavity and lining the second gate cavity. The method further includes forming a masking layer over and adjacent to a portion of the bulk metal layer lining the second gate cavity. The method further includes performing at least one etching process to recess the bulk metal layer within the first and second gate cavities. The etching process recesses the bulk metal layer within the first gate cavity to its final thickness, and the etching process removes portions of the bulk metal layer lining the second gate cavity not under and not adjacent to the masking layer.

Yet another illustrative method disclosed herein includes forming replacement gate structures for first and second devices. The first device is a short channel device and the second device is a long channel device. The method includes forming a first and a second gate cavity above a semiconductor substrate for the first and second devices, respectively, the first gate cavity being narrower than the second gate cavity. The method further includes forming a bulk metal layer within the first and second gate cavities, the bulk metal layer filling the first gate cavity and lining the second gate cavity. The method further includes forming a second metal layer within the second gate cavity, the second metal layer filling the second gate cavity. The method further includes performing at least one etching process to recess the bulk metal layer within the first and second gate cavities. The etching process recesses the bulk metal layer within the first gate cavity to its final thickness, and the etching process selectively recesses the bulk metal layer lining the second gate cavity relative to the second metal layer.

BRIEF DESCRIPTION OF THE DRAWINGS

The disclosure may be understood by reference to the following description taken in conjunction with the accompanying drawings, in which like reference numerals identify like elements, and in which.

Figure 1A:
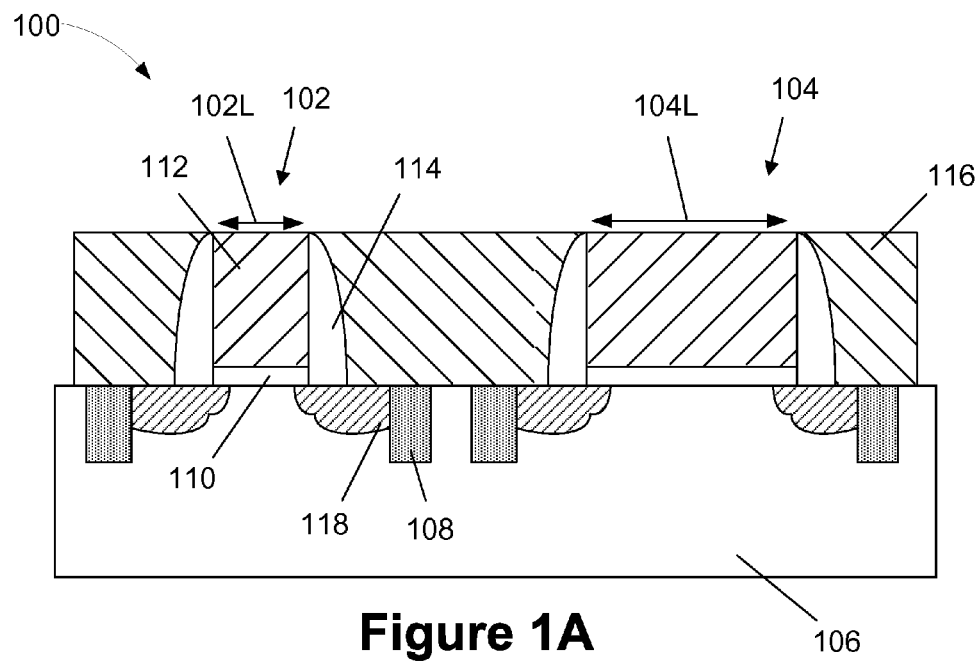
FIGS. 1A-1I depict various illustrative methods disclosed herein of forming gate structures of semiconductor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the disclosure as defined by the appended claims.

Notation and Nomenclature

Certain terms are used throughout the disclosure to refer to particular components. However, different entities may refer to a component by different names. This document does not intend to distinguish between components that differ in name but not function. The terms "including" and "comprising" are used herein in open-ended fashion, and thus mean "including, but not limited to."

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure relates to various methods of forming gate structures of semiconductor devices. The methods disclosed herein may be employed in manufacturing products using a variety of technologies, e.g., NMOS, PMOS, CMOS, etc., and they may be employed in manufacturing a variety of different devices, e.g., memory devices, logic devices, ASICs, etc. Of course, the disclosure should not be considered limited to the illustrative examples depicted and described herein.

As will be appreciated by those skilled in the art after a complete reading of the present application, the disclosure may be employed in forming integrated circuit products using planar transistor devices, as well as so-called 3D devices, such as FinFETs, or a combination of such devices. For purposes of disclosure, reference will be made to an illustrative process flow wherein integrated circuit products 100, 200, 300, 400 are formed with a plurality of planar transistor devices 102, 104. However, the disclosure should not be considered limited to such illustrative examples. With reference to the attached figures, various illustrative embodiments of the methods and devices disclosed herein will now be described in more detail.

FIG. 1A is a simplified view of an illustrative integrated circuit product 100 at an early stage of manufacturing, wherein a pair of illustrative semiconductor devices 102, 104 have been formed in and above the semiconductor substrate 106. The substrate 106 may have a variety of configurations, such as the depicted bulk silicon configuration. The substrate 106 may also have a silicon-on-insulator (SOI) configuration that includes a bulk silicon layer, a buried insulation layer and an active layer, wherein the semiconductor devices 102, 104 are formed in and above the active layer. The substrate 106 may be made of silicon or it may be made of materials other than silicon. Thus, the terms "substrate" or "semiconductor substrate" should be understood to cover all semiconducting materials and all forms of such materials.

A replacement gate process may be used when forming the gate structures of planar devices or 3D devices. As shown in FIG. 1A, the process includes the formation of structures above an active area of the substrate 106 that is defined by shallow trench isolation structures 108. The various components and structures of the product 100 may be formed using a variety of known techniques, e.g., a chemical vapor deposition (CVD) process, an atomic layer deposition (ALD) process, a thermal growth process, spin-coating techniques, etc. At the point of fabrication depicted in FIG. 1A, the integrated circuit product 100 includes two devices 102, 104 having different channel lengths 102L and 104L. More specifically, the device 102 is a "short channel" device, which, for purposes of this disclosure and the attached claims, shall be understood to be a transistor device wherein the gate length 102L is 40 nm or less. On the other hand, the device 104 is a "long channel" device, which, for purposes of this disclosure and the attached claims, shall be understood to be a transistor device wherein the gate length 104L is greater than 40 nm. At this point in the process flow, each device 102, 104 includes a sacrificial gate insulation layer 110, a dummy or sacrificial gate electrode 112, an outermost sidewall spacer 114, a layer of insulating material 116 and source/drain regions 118 formed in the substrate 106. For simplicity, the two devices 102, 104 are depicted as being formed side-by-side on the substrate 106. However, in practice, the devices 102, 104 may be positioned remotely from one another on the substrate 106.

The various components and structures of the devices 102, 104 may be formed using a variety of different materials. For example, the sacrificial gate insulation layers 110 may be made of silicon dioxide, the sacrificial gate electrodes 112 may be made of polysilicon, the sidewall spacer 114 may be made of silicon nitride and the layer of insulating material 116 may be made of silicon dioxide. The source/drain regions 118 typically include implanted dopant materials (N-type dopants for NMOS devices and P-type dopants for PMOS devices) that are implanted into the substrate 106 using known masking and ion implantation techniques. A chemical mechanical polishing (CMP) process may be performed to remove any materials above the sacrificial gate electrodes 112 (such as a protective cap layer (not shown) made of silicon nitride) so that at least the sacrificial gate electrodes 112 may be removed.

Figure 1B:
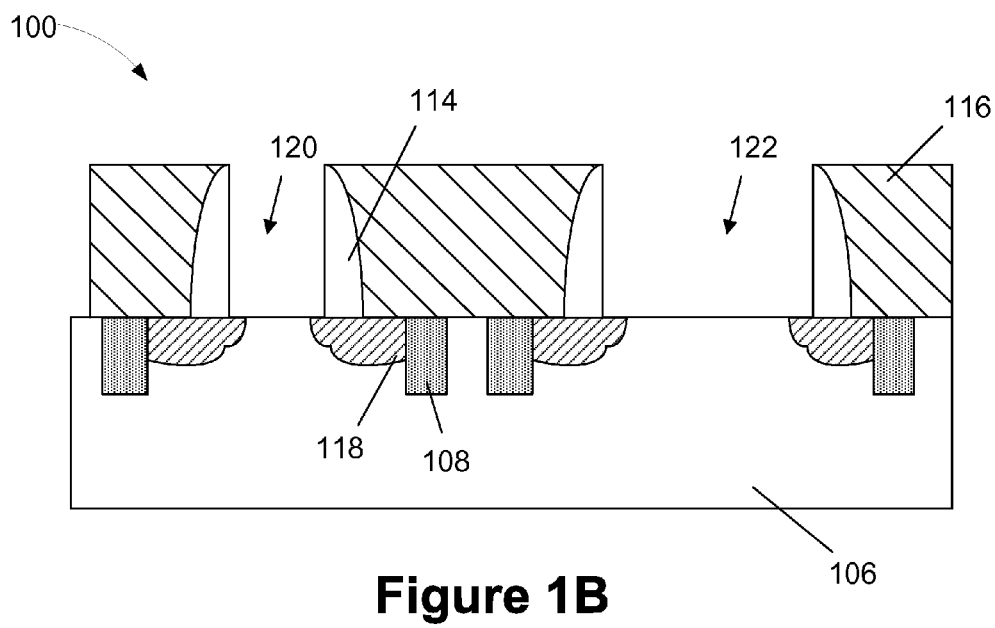

As shown in FIG. 1B, one or more anisotropic etching processes were performed to remove the sacrificial gate electrodes 112 and the sacrificial gate insulation layers 110 to thereby define openings or gate cavities 120, 122 where replacement gate structures will subsequently be formed. As shown, due to the different channel lengths 102L and 104L, the gate cavity 120 is narrower than the gate cavity 122.

Typically, the sacrificial gate insulation layers 110 are removed as part of the replacement gate technique, as depicted herein. However, the sacrificial gate insulation layers 110 may not be removed in all applications.

Figure 1C:
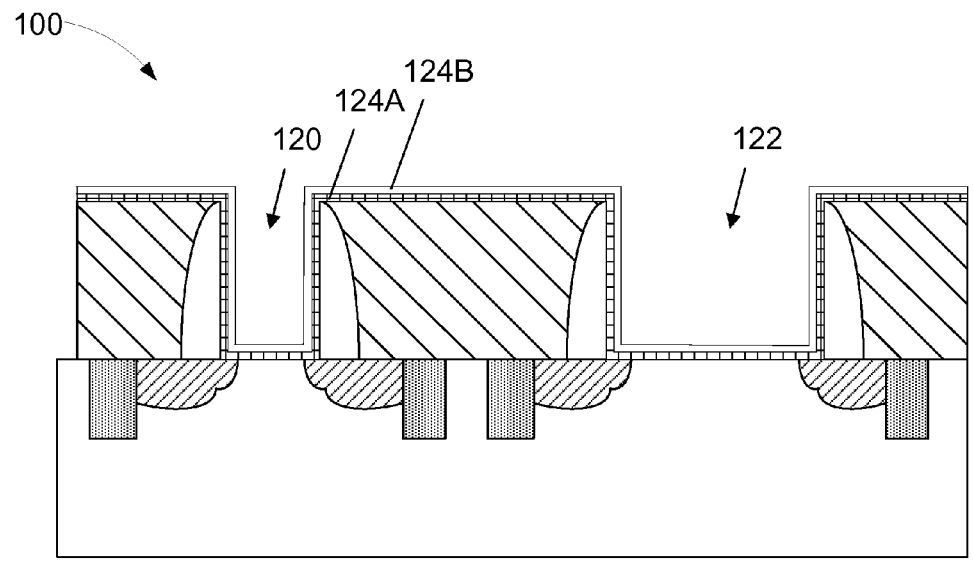
Figure 1D:
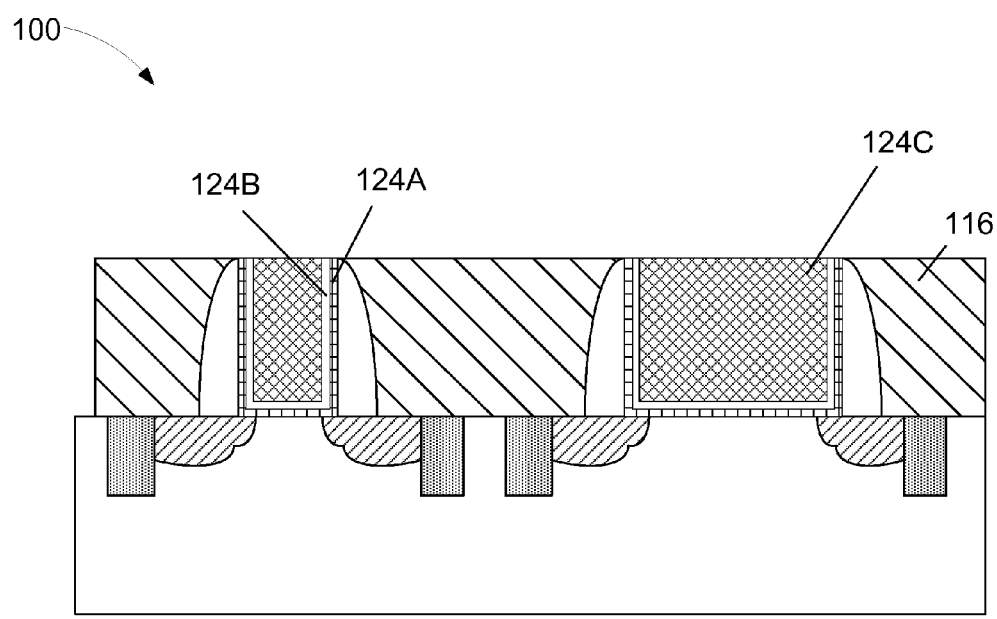

Next, as shown in FIGS. 1C-1D, various layers of material that will constitute replacement gate structures 124, 125 (shown in FIG. 1I) are formed in the gate cavities 120, 122. As shown in FIG. 1C, a high-k gate insulation layer 124A was conformably deposited onto the product 100 and within the gate cavities 120, 122. For simplicity, various deposition processes may be illustrated with sharp corners, though those corners may have a rounded configuration in a real-world device. As used herein and in the attached claims, a high-k material is a material having a dielectric constant, or k-value, of approximately 10 or greater. As described above, the high-k gate insulation layer may 124A be made of various materials and deposited in various thicknesses in various embodiments. Next, a work function metal layer 124B was conformably deposited onto the product 100 on the high-k gate insulation layer 124A and within the gate cavities 120, 122. As described above, the work function metal layer 124B may be made of various materials and deposited in various thicknesses depending upon the application. In one illustrative embodiment, the work function metal layer 124B is made of titanium nitride.

FIG. 1D depicts the product after several process operations were performed. First, a bulk metal layer 124C was deposited onto the product 100 on the work function metal layer 124B so as to overfill the gate cavities 120, 122. Next, a CMP process was performed to remove excess materials from outside the gate cavities 120, 122 and to planarize the surface of the product 100. In one illustrative embodiment, the bulk metal layer 124C is made of tungsten. However, in various embodiments, the bulk metal layer 124C may be made of other metals and thicknesses depending upon the application.

Figure 1E:
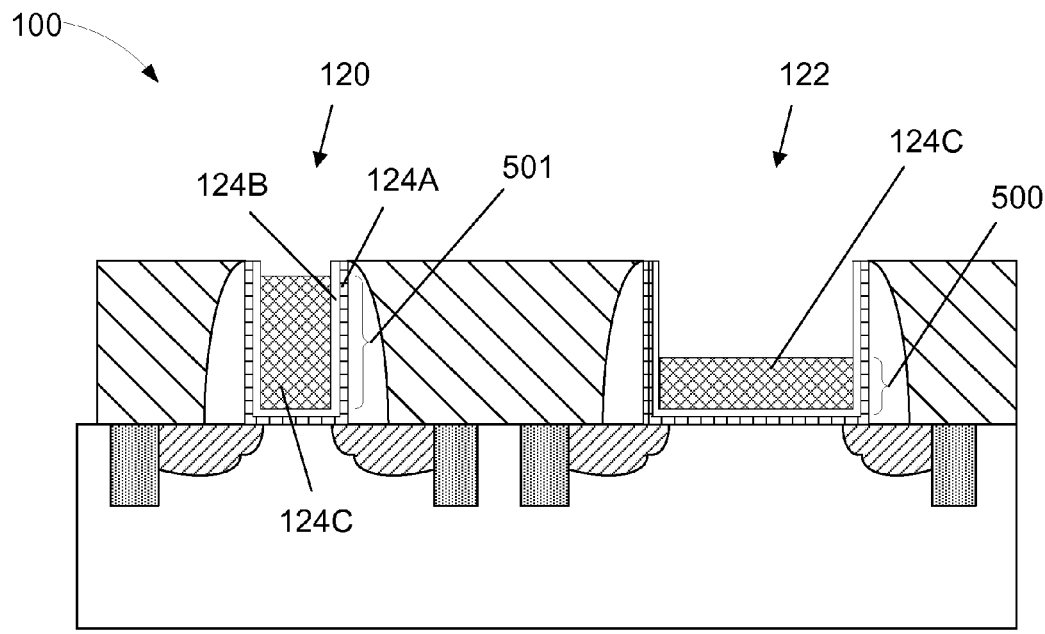

As shown in FIG. 1E, a timed etching process was performed to recess the bulk metal layer 124C within the gate cavities 120, 122. The bulk metal layer 124C within the wider gate cavity 122 was recessed to a lower height or lesser thickness than the bulk metal layer 124C in the narrower gate cavity 120, despite being subject to the same timed etching process. Such differential recessing occurs due to the larger grain size and surface area of the bulk metal layer 124C in the wider gate cavity 122. In at least one embodiment, the etching process recessed the bulk metal layer 124C within the wider cavity 122 to its final thickness. The magnitude of the differential recessing may vary depending upon the particular application. In at least one embodiment, the thickness 500 of the bulk metal layer 124C in the wider cavity 122 is at least 5-40 nm less than the thickness 501 of the bulk metal layer 124C in the narrower cavity 120. The thickness may vary depending upon the application.

Figure 1F:
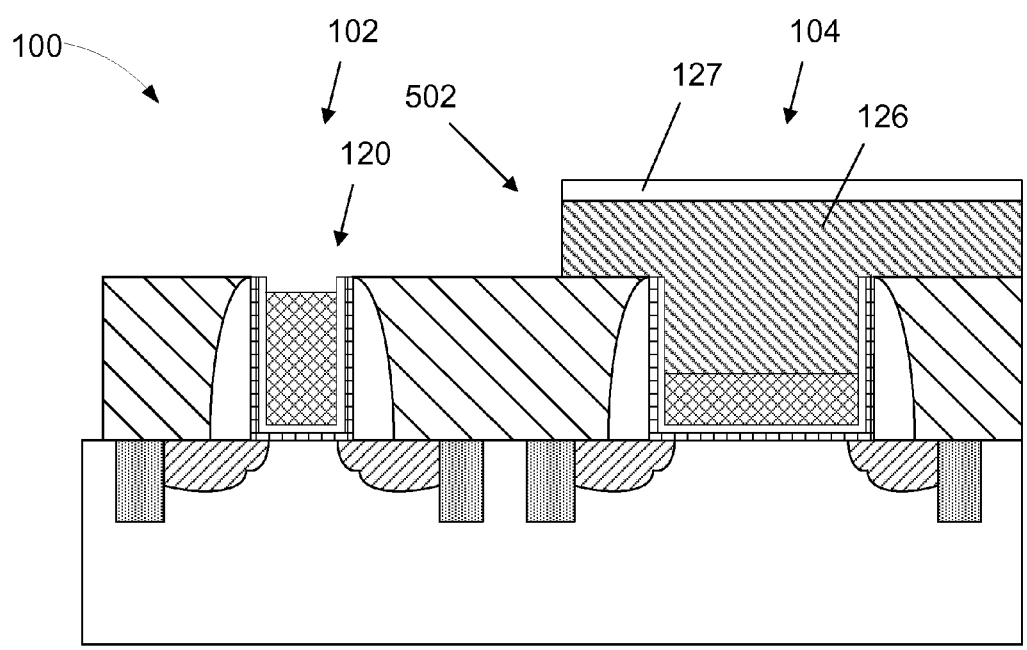

As shown in FIG. 1F, a patterned masking layer 502 was deposited onto the product 100 and over the gate cavities 120, 122. In one illustrative embodiment, the patterned masking layer 502 is made of a protective layer 126 and an anti-reflective coating (ARC) layer 127. In at least one embodiment, the protective layer 126 may be an optical planarization layer (OPL). The OPL may be formed by performing a spin-coating process and thereafter drying the OPL material. The ARC layer 127 may be made of a variety of materials in various embodiments, such as silicon nitride, silicon oxynitride, silicon or carbon-containing organic polymers, etc. depending upon the application. In at least one embodiment, the ARC layer 127 is titanium-based. Next, a photoresist layer (not shown) was deposited onto the ARC layer 127.

Next, the ARC layer 127 and protective layer 126 were patterned according to the exposed photoresist pattern such that the ARC layer 127 and protective layer 126 were removed from above the first device 102 and, specifically, the narrower gate cavity 120. The etching chemistry employed to etch an OPL may be, for example, an argon/oxygen-based etching process. The protective layer 126 was not removed from above the second device 104 and, specifically, the wider gate cavity 122.

Figure 1G:
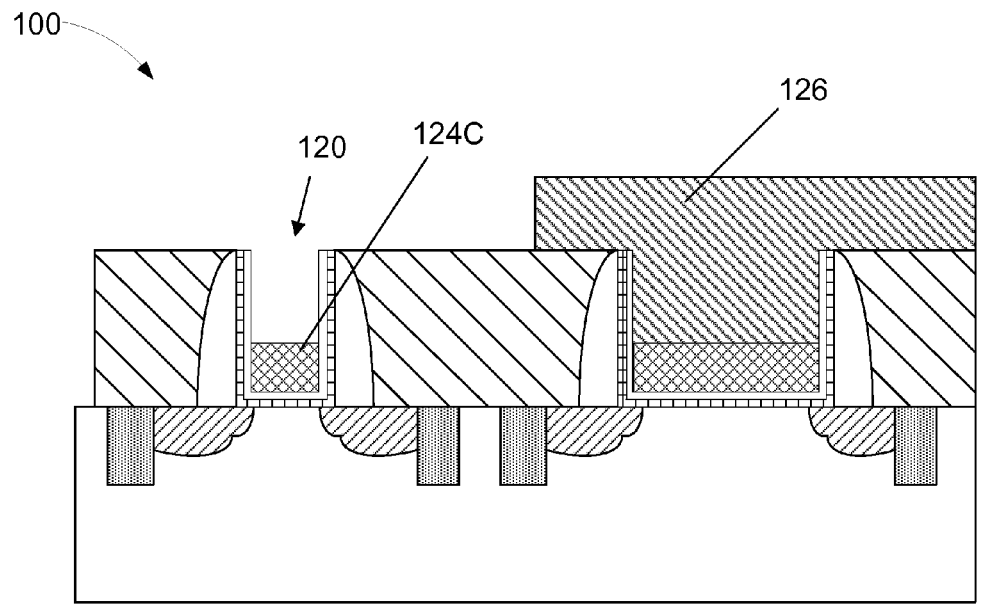

As shown in FIG. 1G, the remaining portions of the photoresist layer were removed, and an anisotropic etching process was performed to remove the ARC layer 127 using the protective layer 126 as an etch stop. Next, a timed etching process was performed to recess the bulk metal layer 124C within the narrower gate cavity 120. The masking layer 502 protects the bulk metal layer 124C within the wider gate cavity 122 from the etching process. In at least one embodiment, the etching process forms the bulk metal layer 124C within the narrower gate cavity 120 to its final thickness, and the final thicknesses of the bulk metal layer 124C within the two cavities 120, 122 are substantially the same. In other embodiments, the thicknesses of the bulk metal layer 124C within the two cavities 120, 122 may vary depending upon the application.

Figure 1H:
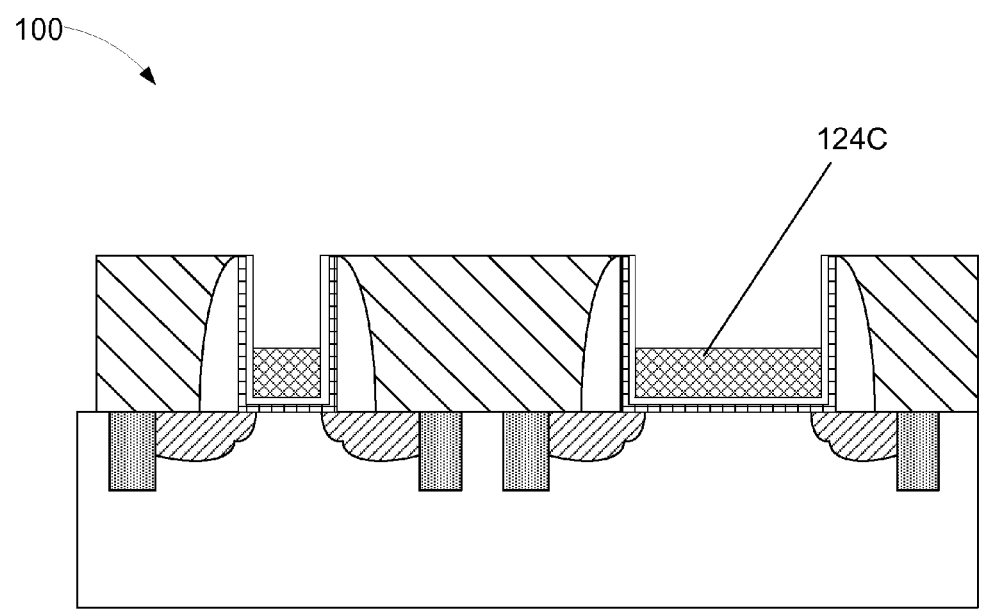

As shown in FIG. 1H, an anisotropic etching process was performed to remove the protective layer 126.

Figure 1I:
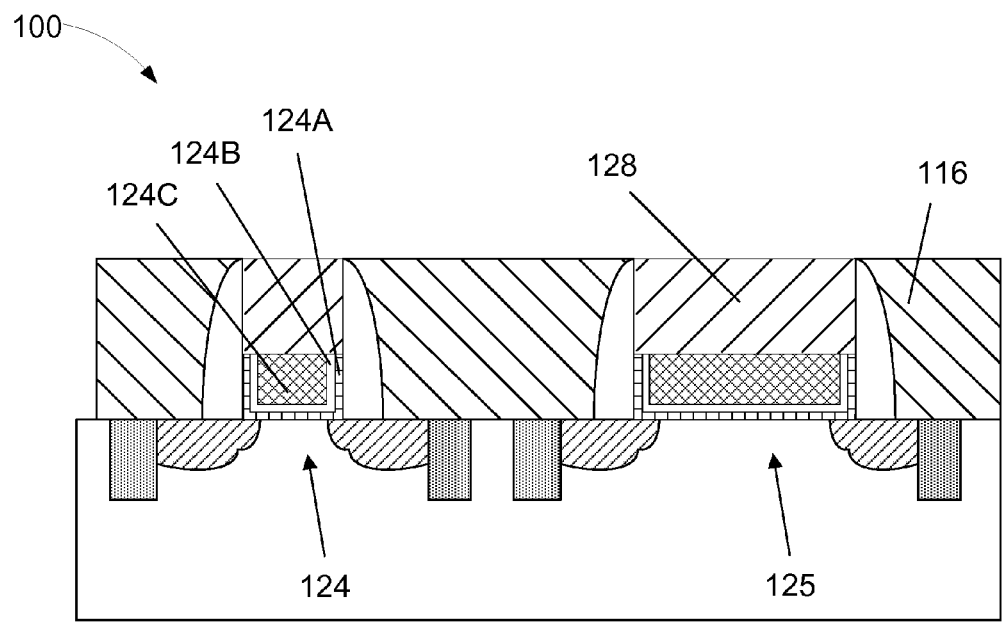

FIG. 1I depicts the product after several process operations were performed. First, one or more timed etching processes were performed to recess the high-k gate insulation layer 124A and the work function metal layer 124B to a height substantially planar with the bulk metal layer 124C. Next, a layer of gate cap material 128, such as silicon nitride, was deposited onto the product 100 above the completed gate structures 124, 125 so as to overfill the cavities 120, 122. Then, a CMP process was performed to remove any excess material positioned above the surface of the layer of insulating material 116 and to planarize the surface of the product 100 using the layer of insulating material 116 as a polish stop. The gate cap layer 128 was formed to protect the underlying gate materials during subsequent processing operations.

FIGS. 2A-2F depict another illustrative method of forming gate structures of semiconductor devices. The point of fabrication of the product 200 and devices 102, 104 shown in FIG. 2A corresponds to the point of fabrication shown in FIG. 1E.

Figure 2A:
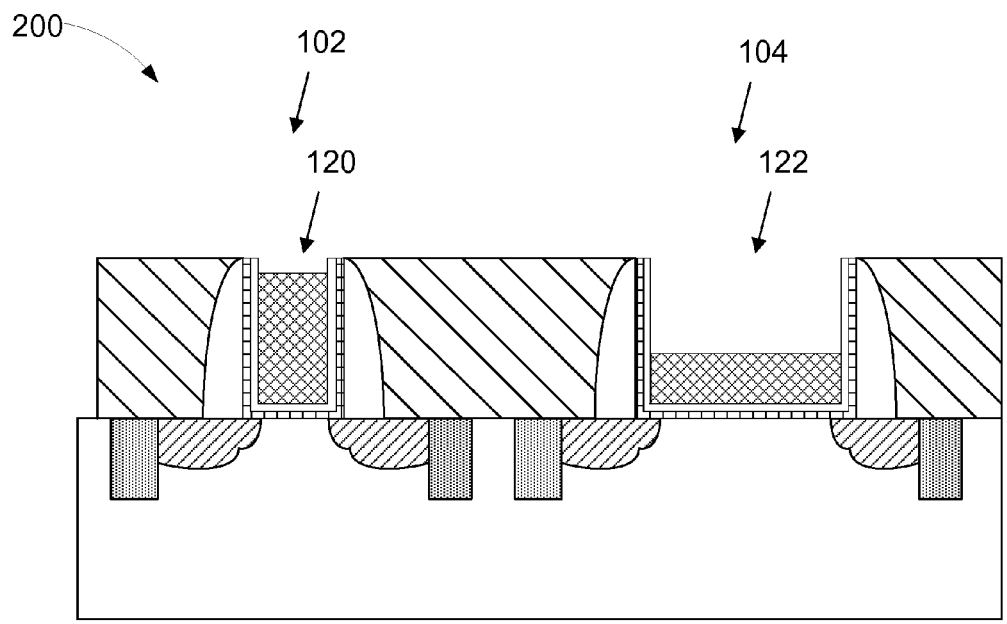
FIGS. 2A-2F depict various illustrative methods disclosed herein of forming gate structures of semiconductor devices.
Figure 2B:
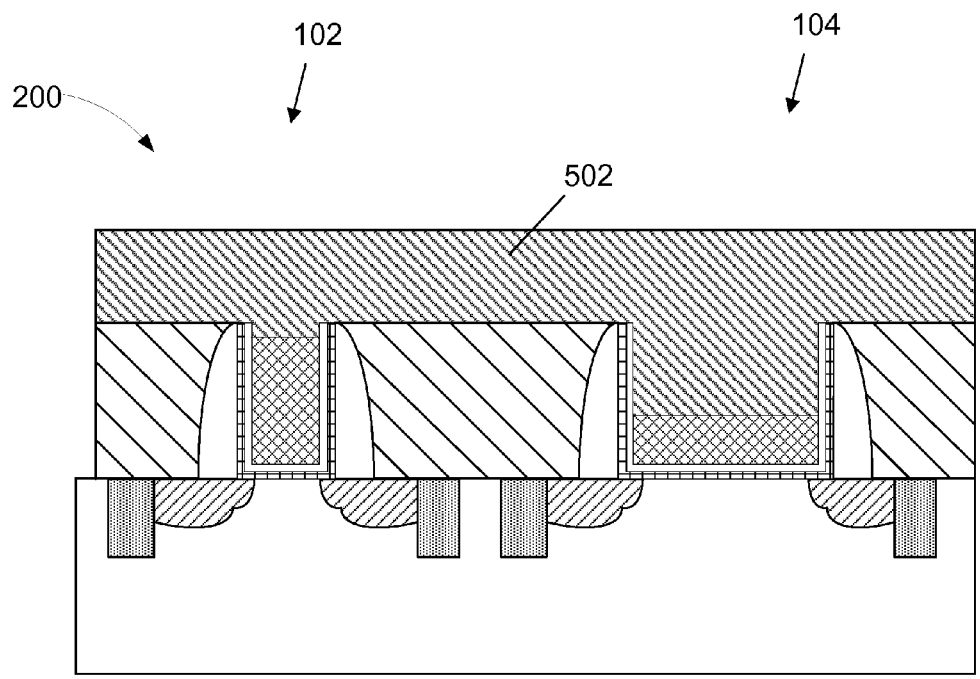

As shown in FIG. 2B, a masking layer 502 such as one including an OPL described above was deposited onto the devices 102, 104 and within the gate cavities 120, 122.

Figure 2C:
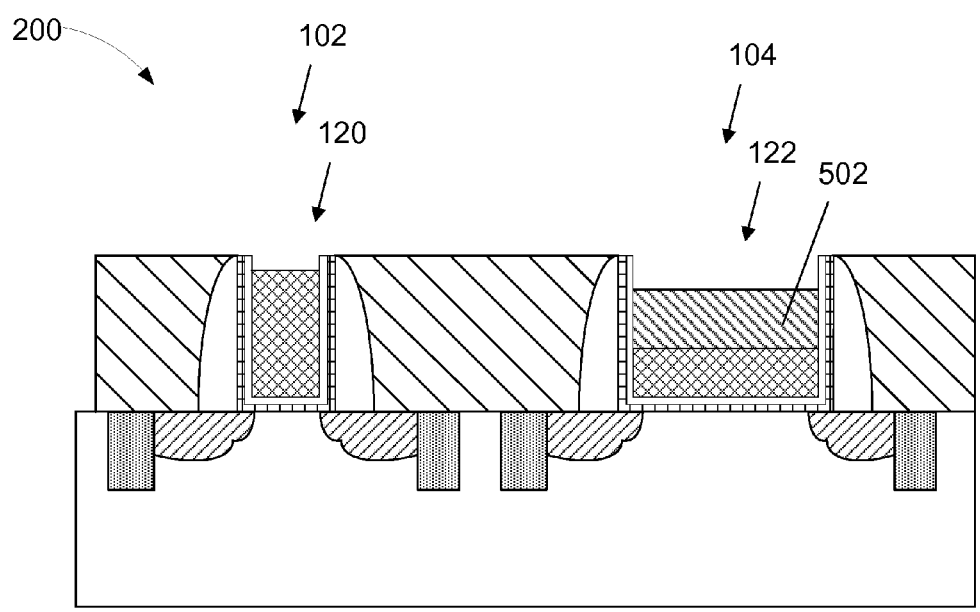

As shown in FIG. 2C, a timed etching process was performed to remove the masking layer 502 from over the first device 102, specifically from within the narrower gate cavity 120, while leaving a portion of the masking layer 502 within the wider gate cavity 122 of the second device 104.

Figure 2D:
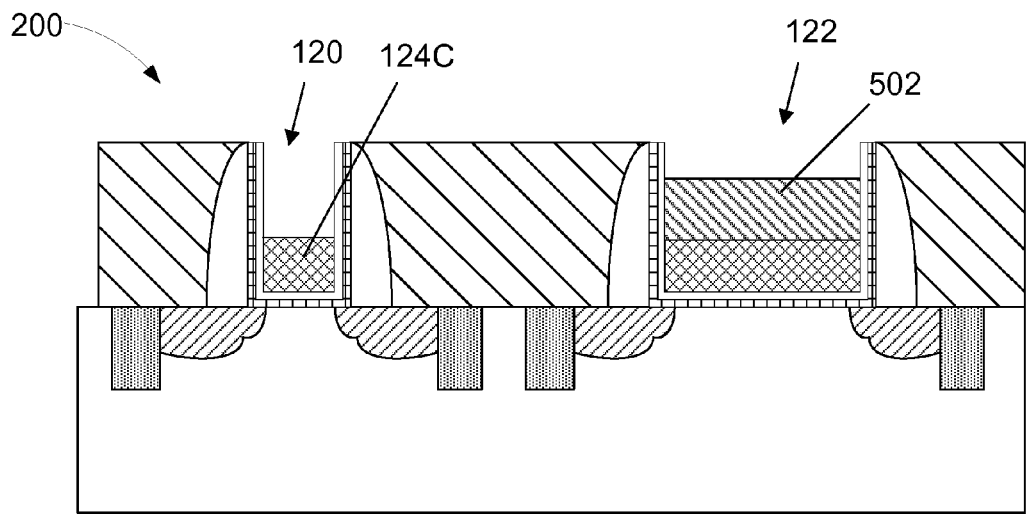

As shown in FIG. 2D, a timed etching process was performed to recess the thicker bulk metal layer 124C within the narrower gate cavity 120 to its final thickness, which is substantially the same thickness as the bulk metal layer 124C within the wider gate cavity 122 in at least one embodiment. The masking layer 502 protects the bulk metal layer 124C within the wider gate cavity 122 from the etching process.

Figure 2E:
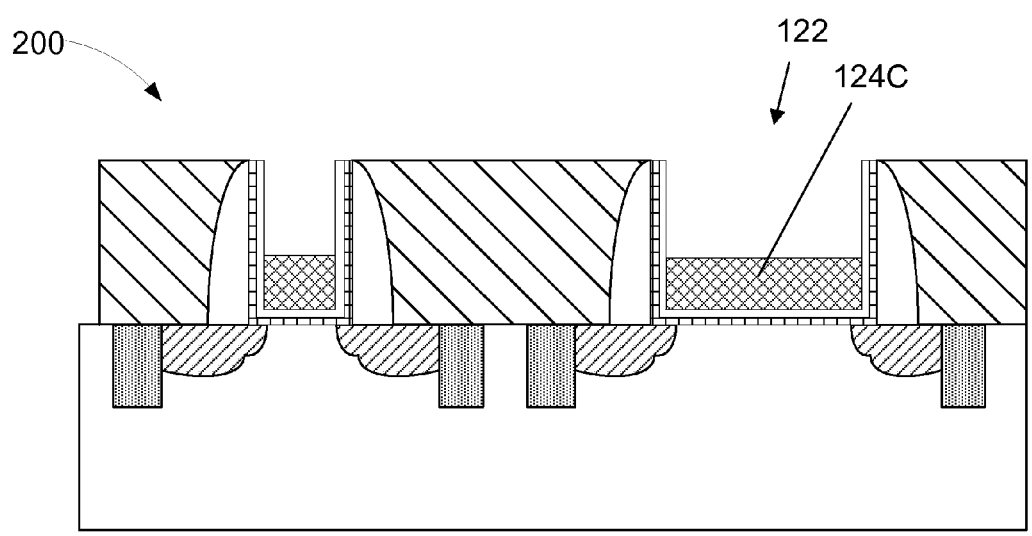

As shown in FIG. 2E, an anisotropic etching process was performed to remove the masking layer 502 within the wider gate cavity 122.

Figure 2F:
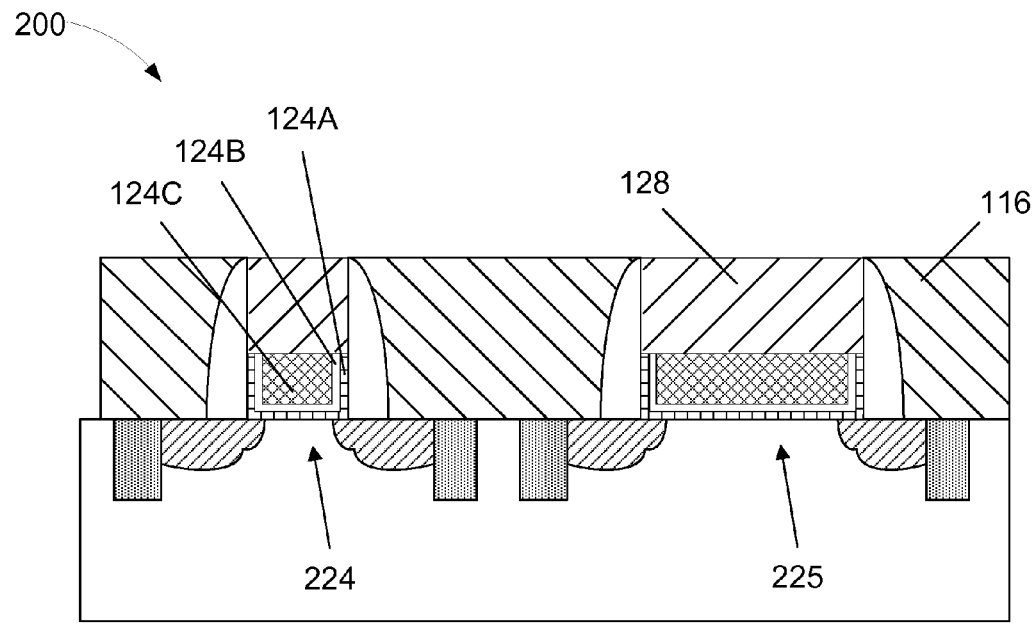

FIG. 2F depicts the product after the above-described process operations were performed to recess the high-k gate insulation layer 124A and work function metal layer 124B to a height substantially planar with the bulk metal layer 124C, and after the above-described gate cap layer 128 was formed in the cavities 120, 122.

FIGS. 3A-3H depict another illustrative method of forming gate structures of semiconductor devices. The point of fabrication of the product 300 and devices 102, 104 shown in FIG. 3A corresponds to the point of fabrication shown in FIG. 1C.

Figure 3A:
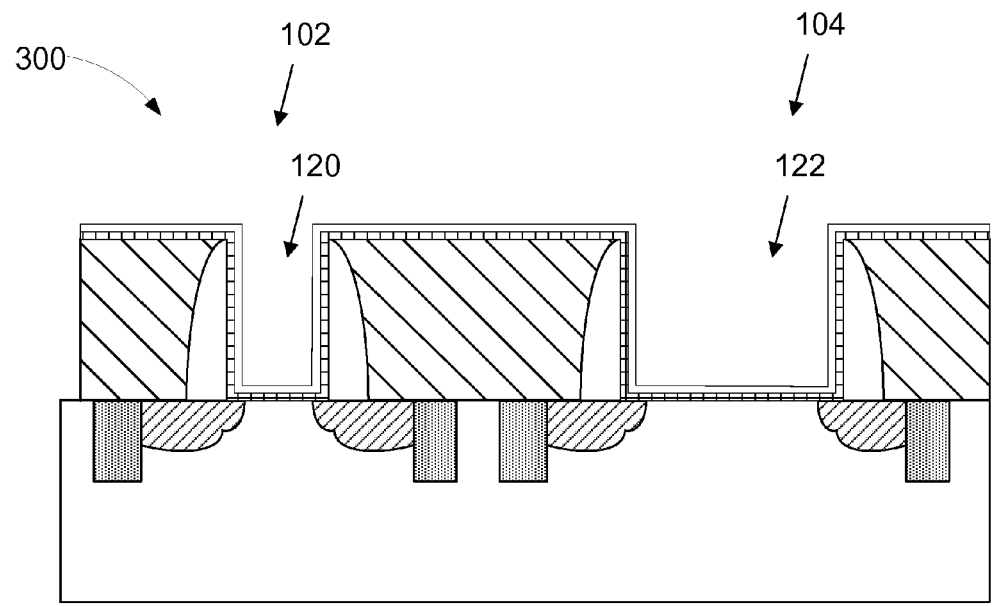
FIGS. 3A-3H depict various illustrative methods disclosed herein of forming gate structures of semiconductor devices.
Figure 3B:
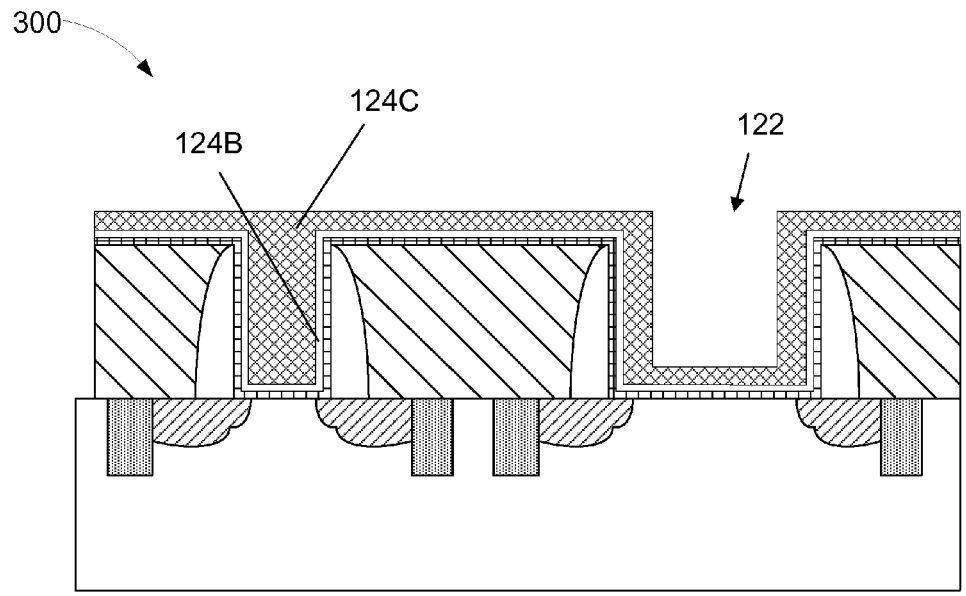

As shown in FIG. 3B, a bulk metal layer 124C was conformably deposited onto the product 300 on the work function metal layer 124B so as to overfill the narrower gate cavity 120 without overfilling the wider gate cavity 122, i.e., it is formed as a liner layer in the wider gate cavity 122. In at least one embodiment, the bulk metal layer 124C was deposited between 20 and 30 nm thick, inclusive. In other embodiments, the thickness may vary depending upon the application.

Figure 3C:
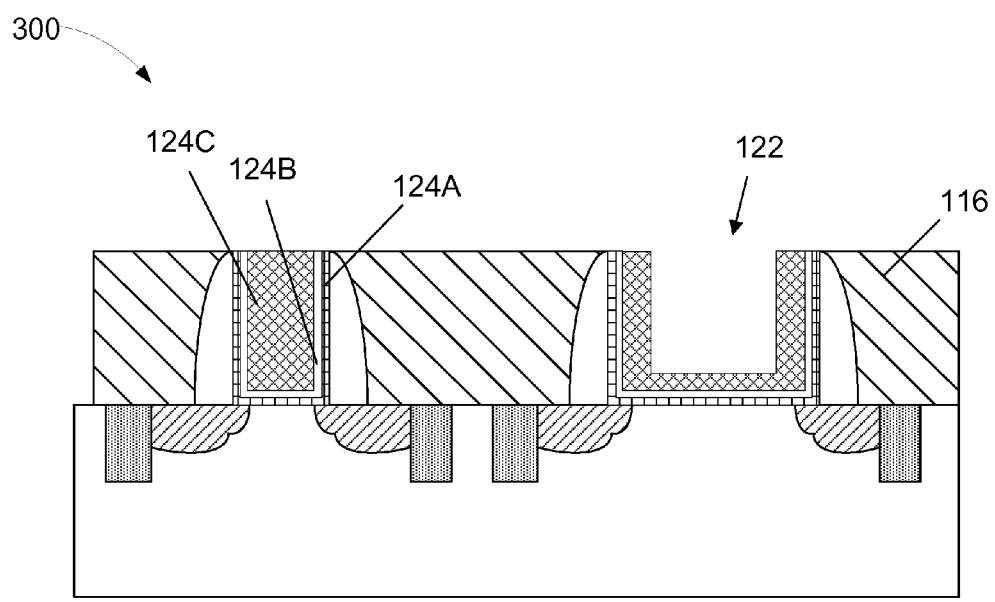

As shown in FIG. 3C, a CMP process was performed to remove any excess bulk metal layer 124C, work function metal layer 124B and high-k gate insulation layer 124A material outside the gate cavities 120, 122 and to planarize the surface of the product 300 using the layer of insulating material 116 as a polish stop.

Figure 3D:
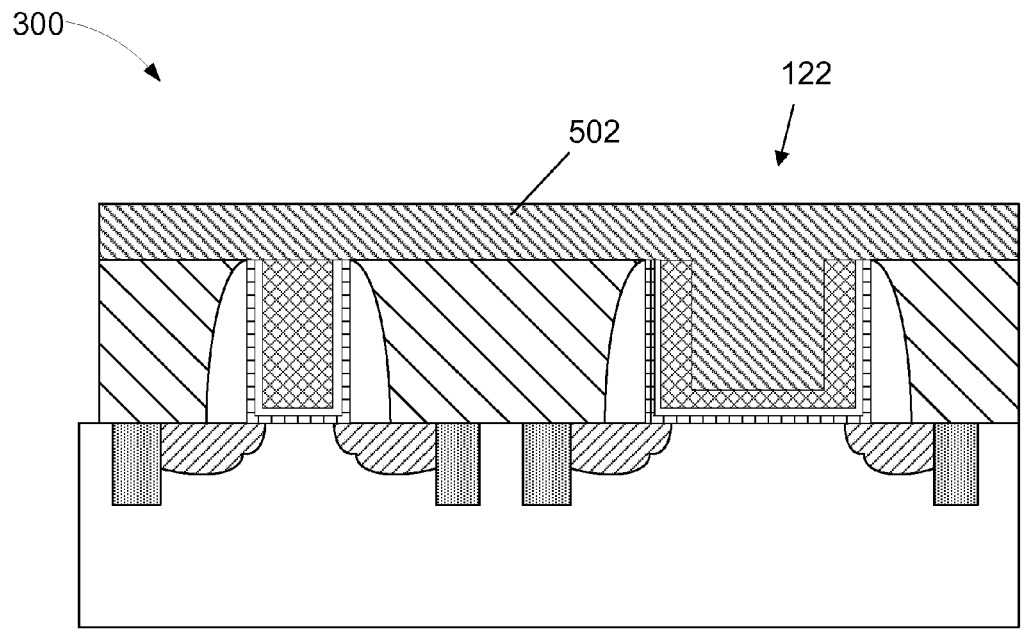

As shown in FIG. 3D, a masking layer 502 such as one including an OPL described above was deposited onto the product 300 so as to overfill the wider gate cavity 122.

Figure 3E:
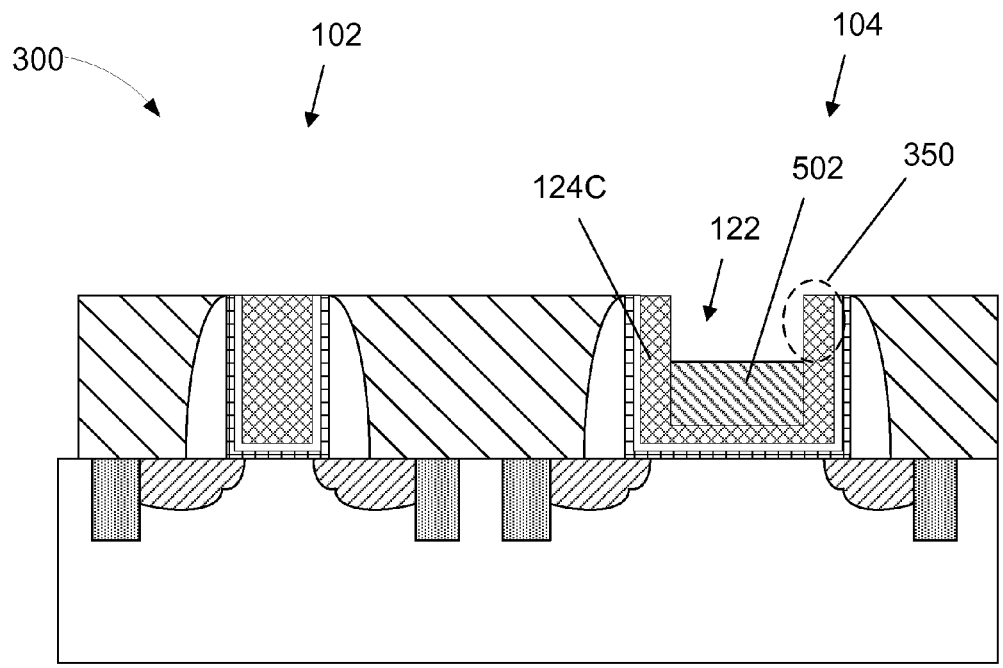

As shown in FIG. 3E, a timed etching process was performed to recess the masking layer 502 such that the masking layer 502 is removed from above the first device 102 while leaving only a portion of the masking layer 502 within the wider gate cavity 122. As shown, the height of the masking layer 502 is lower than the height of the bulk metal layer 124C within the wider gate cavity 122 such that portions (such as the portion 350 surrounded by a dashed ellipse) of the bulk metal layer 124C within the wider gate cavity 122 are not protected by the masking layer 502.

Figure 3F:
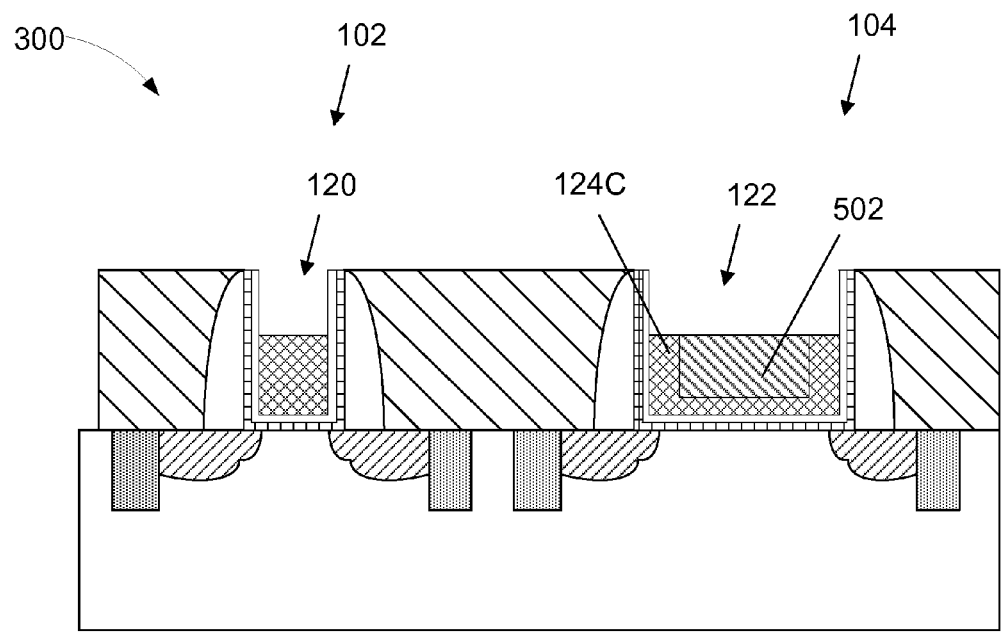

As shown in FIG. 3F, a timed etching process was performed to recess the exposed portions of the bulk metal layer 124C within the gate cavities 120, 122. As shown, the bulk metal layer 124C within the narrower gate cavity 120 was recessed to its final thickness, which is substantially the same as the thickness of the bulk metal layer 124C in combination with the masking layer 502 within the wider gate cavity 122. The bulk metal layer 124C within the wider gate cavity 122 was recessed such that the top of the bulk metal layer 124C is substantially planar with the top of the masking layer 502. Specifically, the masking layer 502 protected the portions of the bulk metal layer 124C within the wider gate cavity 122 under or adjacent to the masking layer 502 from the etching process. As such, the portions of the bulk metal layer 124C within the wider gate cavity 122 not under and not adjacent to the masking layer 502 were removed.

Figure 3G:
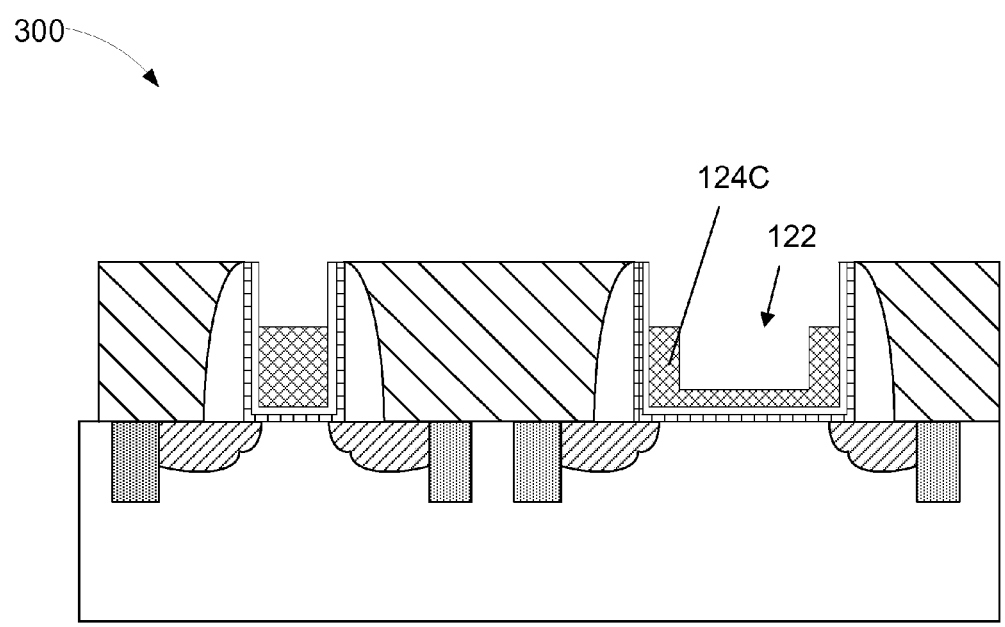

As shown in FIG. 3G, an anisotropic etching process was performed to remove the masking layer 502 within the wider gate cavity 122.

Figure 3H:
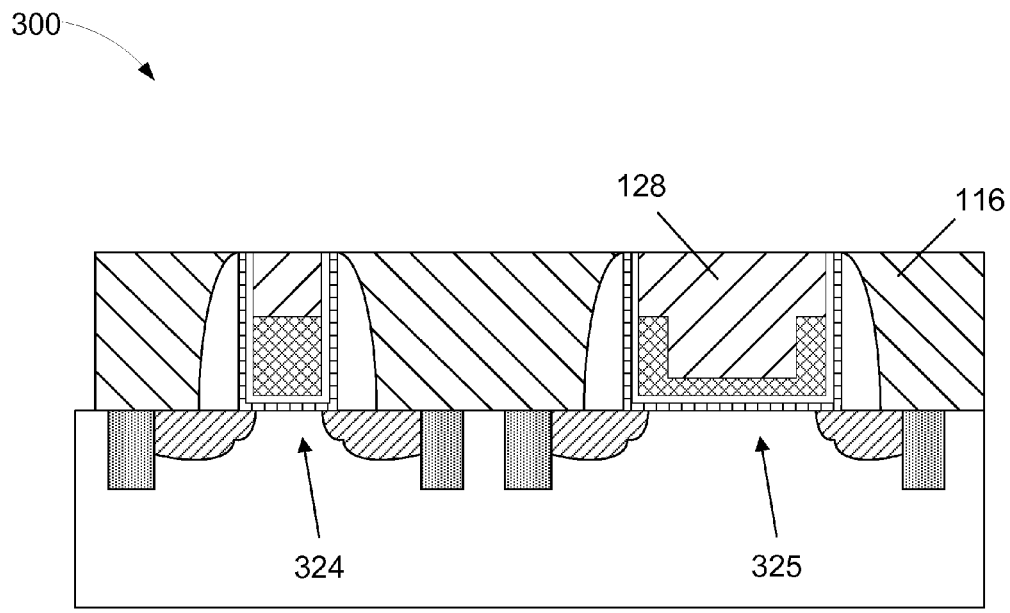

As shown in FIG. 3H, a layer of gate cap material 128, such as silicon nitride, was deposited onto the product 300 above the completed gate structures 324, 325 so as to overfill the cavities 120, 122. Next, a CMP process was performed to remove any excess material positioned above the surface of the layer of insulating material 116 and to planarize the surface of the product 300 using the layer of insulating material 116 as a polish stop. The gate cap layer 128 was formed to protect the underlying gate materials during subsequent processing operations.

FIGS. 4A-4E depict another illustrative method of forming gate structures of semiconductor devices. The point of fabrication of the product 400 and devices 102, 104 shown in FIG. 4A corresponds to the point of fabrication shown in FIG. 3B.

Figure 4A:
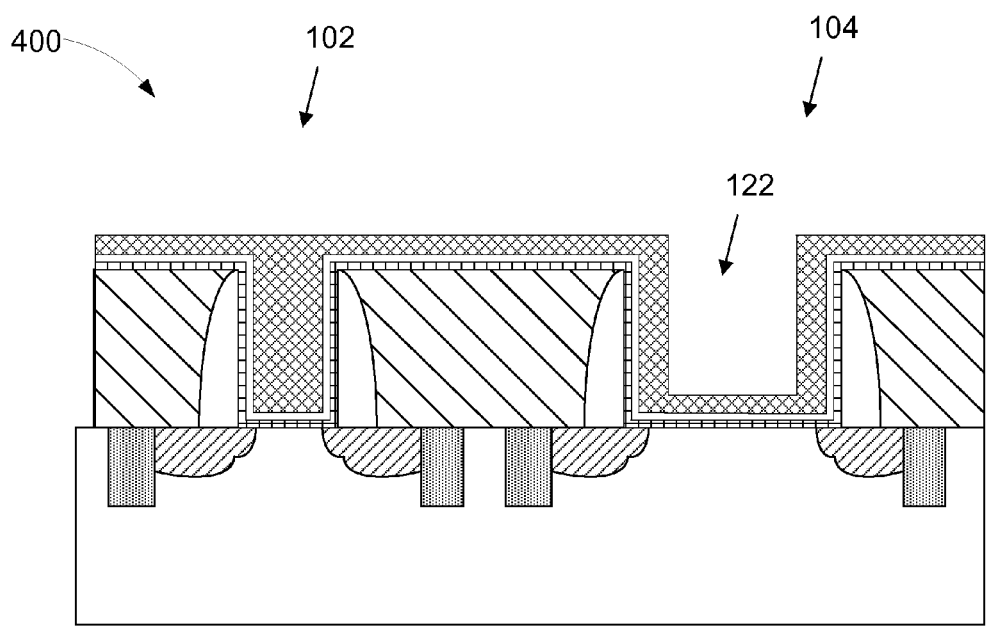
FIGS. 4A-4E depict various illustrative methods disclosed herein of forming gate structures of semiconductor devices.
Figure 4B:
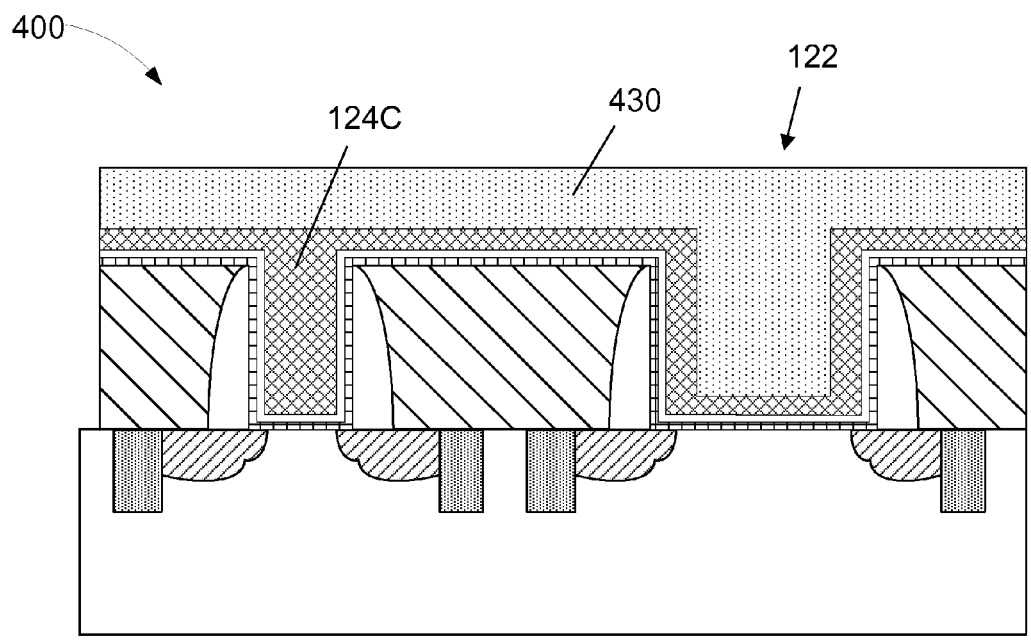

As shown in FIG. 4B, a second metal layer 430, such as titanium nitride, was deposited onto the product 400 so as to overfill the wider gate cavity 122. In various embodiments, the second metal layer 430 may be made of other metals that may be etched relative to the bulk metal layer 124C, depending upon the application.

Figure 4C:
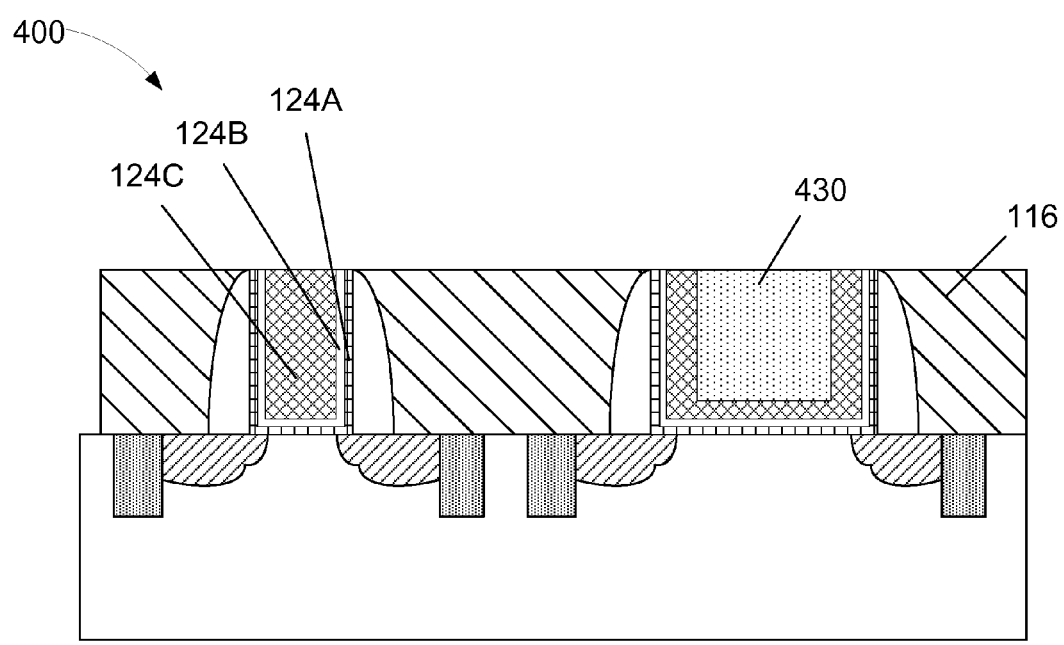

As shown in FIG. 4C, a CMP process was performed to remove any excess second metal layer 430, bulk metal layer 124C, work function metal layer 124B and high-k gate insulation layer 124A material outside the gate cavities 120, 122 and to planarize the surface of the product 400 using the layer of insulating material 116 as a polish stop.

Figure 4D:
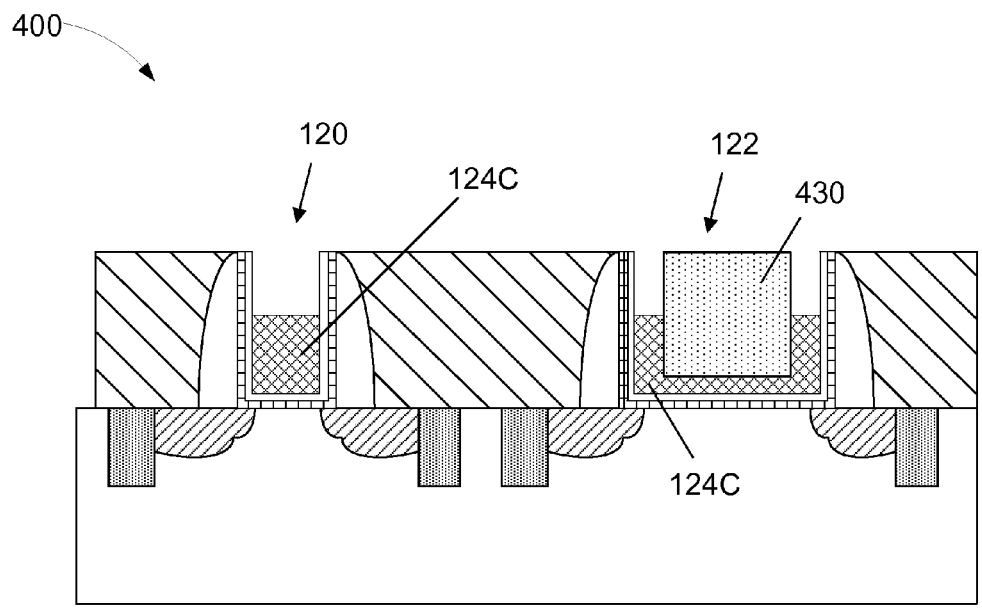

As shown in FIG. 4D, a timed etching process was performed to recess the bulk metal layer 124C within the gate cavities 120, 122. The presence of the second metal layer 430 within the wider gate cavity 122 reduces the surface area of bulk metal layer 124C available to the etching process and consequently reduces the etch rate to substantially the same etch rate as the bulk metal layer 124C within the narrower gate cavity 120. As such, the etching of the bulk metal layer 124C within the cavities 120, 122 can occur simultaneously, thus reducing the total number of process steps.

Figure 4E:
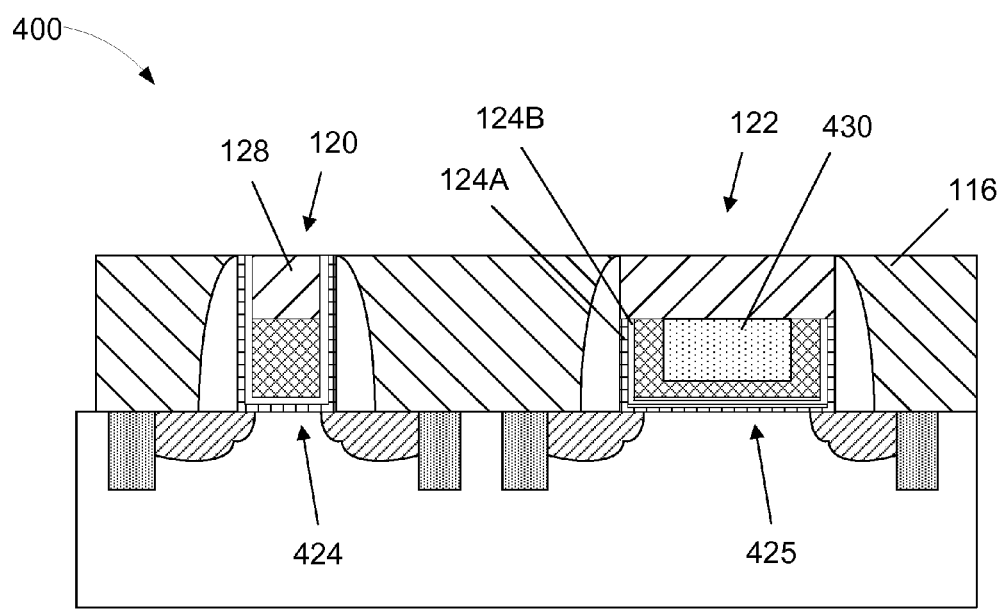

FIG. 4E depicts the product after several process operations were performed. First, one or more etching processes recessed the second metal layer 430, the work function metal layer 124B and the high-k gate insulation layer 124A within the wider gate cavity 122. Next, a layer of gate cap material 128, such as silicon nitride, was deposited onto the product 400 above the completed gate structures 424, 425 so as to overfill the cavities 120, 122. Next, a CMP process was performed to remove any excess material positioned above the surface of the layer of insulating material 116 and to planarize the surface of the product 400 using the layer of insulating material 116 as a polish stop. The gate cap layer 128 was formed to protect the underlying gate materials during subsequent processing operations.

The particular embodiments disclosed above are illustrative only, as the disclosure may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the disclosure. Note that the use of terms such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method of forming replacement gate structures for first and second devices, wherein said first device is a short channel device and said second device is a long channel device, comprising:
    forming a first gate cavity and a second gate cavity above a semiconductor substrate for said first and second devices, respectively, said first gate cavity being narrower than said second gate cavity;
    forming a bulk metal layer within said first and second gate cavities;
    performing at least one first recess etching process to recess said bulk metal layer within said first and second gate cavities, said at least one first etching process recessing said bulk metal layer within said second gate cavity to its final thickness;
    forming a masking layer that covers said bulk metal layer within said second gate cavity and exposes said bulk metal layer within said first cavity; and
    with said masking layer in position, performing at least one second recess etching process to further recess said bulk metal layer within said first gate cavity, said at least one second etching process recessing said bulk metal layer within said first gate cavity to its final thickness.

2. The method of claim 1, wherein forming said masking layer comprises depositing said masking layer over said first and second device and patterning said masking layer to remove said masking layer from over said first device.

3. The method of claim 1, wherein forming said masking layer comprises depositing said masking layer over said first and second device and etching said masking layer over said first and second device such that said masking layer is removed from over said first device but a portion of said masking layer remains over said bulk metal layer within said gate cavity of said second device.

4. The method of claim 1, wherein the final thicknesses of said bulk metal layer within said first and second gate cavities are substantially the same.

5. The method of claim 1, wherein said first gate cavity is less than 40 nm wide, and wherein said second gate cavity is 40 nm or more wide.

6. The method of claim 1, further comprising performing at least one etching process to remove said masking layer.

7. The method of claim 1, wherein said masking layer comprises an optical planarization layer.

8. The method of claim 1, wherein said bulk metal layer comprises tungsten.

9. The method of claim 1 further comprising:
    forming a high-k gate insulation layer within said first and second gate cavities; and
    forming a work function metal layer within said first and second gate cavities.

10. A method of forming replacement gate structures for first and second devices, wherein said first device is a short channel device and said second device is a long channel device, comprising:
    forming a first gate cavity and a second gate cavity above a semiconductor substrate for said first and second devices, respectively, said first gate cavity being narrower than said second gate cavity;
    forming a bulk metal layer within said first and second gate cavities such that said bulk metal layer over-fills said first gate cavity and forms a liner layer of said bulk metal in said second gate cavity;
    forming a masking layer that covers a portion of said bulk metal liner layer in said second gate cavity while leaving a portion of said bulk metal liner layer in said second cavity and said bulk metal layer in said first cavity exposed; and
    performing at least one recess etching process to recess said bulk metal layer within said first gate cavity and said exposed portions of said bulk metal liner layer in said second gate cavity, said at least one recess etching process recessing said bulk metal layer within said first gate cavity to its final thickness and removing said exposed portions of said bulk metal liner layer in said second gate cavity.

11. The method of claim 10, wherein forming said masking layer comprises depositing said masking layer over said first and second device and etching said masking layer over said first and second device such that said masking layer is removed from over said first device but a portion of said masking layer remains over and adjacent to said portion of said bulk metal liner layer in said second gate cavity.

12. The method of claim 10, wherein forming said bulk metal layer comprises depositing said bulk metal layer between 20 and 30 nm thick, inclusive.

13. The method of claim 10, wherein said first gate cavity is less than 40 nm wide, and wherein said second gate cavity is 40 nm or more wide.

14. The method of claim 10, wherein said masking layer comprises an optical planarization layer.

15. A method of forming replacement gate structures for first and second devices, wherein said first device is a short channel device and said second device is a long channel device, comprising:
   forming a first gate cavity and a second gate cavity above a semiconductor substrate for said first and second devices, respectively, said first gate cavity being narrower than said second gate cavity;
   forming a bulk metal layer within said first and second gate cavities, said bulk metal layer filling said first gate cavity and lining said second gate cavity;
   forming a second metal layer within said second gate cavity, said second metal layer filling said second gate cavity; and
   performing at least one recess etching process to recess said bulk metal layer within said first and second gate cavities, said at least one recess etching process recessing said bulk metal layer within said first gate cavity to its final thickness, said at least one recess etching process selectively recessing said bulk metal layer lining said second gate cavity relative to said second metal layer.

16. The method of claim 15, wherein forming said second metal layer comprises depositing said second metal layer over said first and second devices and performing a CMP process to remove excess second metal layer material outside said gate cavity of said second device.

17. The method of claim 15, wherein said second metal layer comprises titanium nitride.

18. The method of claim 15, wherein forming said bulk metal layer comprises depositing said bulk metal layer between 20 and 30 nm thick, inclusive.

19. The method of claim 15, wherein said first gate cavity is less than 40 nm wide, and wherein said second gate cavity is 40 nm or more wide.

20. The method of claim 15, wherein said bulk metal layer comprises tungsten.

* * * * *